United States Patent [19]
Wrobel

[11] 3,911,469
[45] Oct. 7, 1975

[54] METHOD OF FORMING P-N JUNCTION IN PbSnTe AND PHOTOVOLTAIC INFRARED DETECTOR PROVIDED THEREBY

[75] Inventor: Joseph S. Wrobel, Garland, Tex.

[73] Assignee: Texas Instruments Incorporated, Dallas, Tex.

[22] Filed: Feb. 25, 1974

[21] Appl. No.: 445,412

[52] U.S. Cl. ...................... 357/30; 357/61; 357/63; 357/88; 148/186; 148/190; 250/338

[51] Int. Cl. ............................................ H01l 15/00

[58] Field of Search .................. 357/30, 61, 63, 88; 250/338; 148/186, 190

[56] References Cited

UNITED STATES PATENTS 3,673,063 6/1972 Wakefield ............................ 29/583
3,716,424 2/1973 Schoolar ............................ 148/175
3,748,593 7/1973 Dimmock .......................... 331/94.5
3,779,801 12/1973 Halloway ........................... 156/603

OTHER PUBLICATIONS

Donnelly, et al., "$Pb_{1-x}Sn_xTe$ Photovoltaic Diodes and Diode Lasers Produced by Proton Bombardment," Solid State Electronics, pp. 403–407, 1972.

Holloway et al., Journal of Applied Physics, Vol. 41, No. 8, July 1970, pp. 3543–3545.

*Primary Examiner*—Martin H. Edlow
*Attorney, Agent, or Firm*—Harold Levine; James T. Comfort; William E. Hiller

[57] ABSTRACT

This disclosure is directed to a method of forming a P-N junction in PbSnTe material in providing an infrared radiation diode detector, wherein signal radiation is absorbed in a low carrier concentration *n*-layer such that a Burstein Shift is not exhibited, while the bulk of the P-N junction is *p*-type material of high carrier concentration to prevent surface inversion. The method employs diffusion of a defect compensating impurity such as cadmium or zinc into unannealed PbSnTe material dominated by *n*-type background impurities. The diffusion of cadmium or zinc has a compensating effect on the *p*-type stoichiometric defects found in unannealed PbSnTe which results in a substantial reduction in the adverse effect of surface inversion layers and surface leakage, thereby achieving an improved operating performance from PbSnTe photovoltaic detectors so made.

9 Claims, 6 Drawing Figures

CURRENT—VOLTAGE CHARACTERISTICS

SPOT SCAN, CADMIUM—DIFFUSED DIODE

SPOT SCANS, ALUMINUM—DIFFUSED DIODES

METHOD OF FORMING P-N JUNCTION IN PbSnTe AND PHOTOVOLTAIC INFRARED DETECTOR PROVIDED THEREBY

The present invention relates to a method for forming a P-N junction in PbSnTe material for providing an infrared radiation diode detector and to the detector produced thereby. More particularly, the present method involves the diffusion of a defect compensating impurity, such as cadmium or zinc, into unannealed PbSnTe material dominated by *n*-type background impurities to compensate for *p*-type stoichiometric defects found in the unannealed PbSnTe.

Typically, infrared radiation diode detectors are formed by employing diffusion techniques to provide P-N junctions in suitable semi-conductor material. One such suitable semiconductor material employed in diode detectors of this character is $Pb_{1-x}Sn_xTe$. Heretofore, P-N junctions have been formed in $Pb_{1-x}Sn_xTe$ material to provide diode detectors by any of the following procedures: by subjecting the $Pb_{1-x}Sn_xTe$ substrate material to an annealing treatment for varying the majority carrier concentration, by diffusion of antimony (Sb), by diffusion of aluminum (Al), or by diffusion of indium (In). With the exception of antimony diffusion, however, all of these procedures provide P-N junctions characterized by low carrier concentration bulk. Although antimony-diffused P-N junctions do provide exceptionally good diode properties, the long wavelength spectral responses of photovoltaic detectors with this type of P-N junction exhibit a severe Burstein shift and are consequently unsatisfactory. The P-N junctions formed in low carrier concentration $Pb_{1-x}Sn_xTe$ do not exhibit a Burstein shift and are considered useful as infrared detectors. Each of these P-N junctions characterized by low carrier concentration bulk does suffer from a so-called "surface inversion" effect in that the *p*-type surface of the junction has a strong tendency to invert to *n*-type, thereby causing severe leakage in such diodes. This surface inversion effect may give rise to the formation of thick *n*-type surface skins when damage occurs to the surface and also may cause an anomalous photovoltaic effect known as the Dember effect on thin low carrier concentration PbSnTe. The Dember effect is characterized by a normally photoconductive substrate acting as a photovoltaic substrate because of the unwanted formation of a P-N junction on the surface of the substrate due to surface inversion. The extent of the inversion layer on individual diodes is responsible for a wide range in device impedances for photovoltaic detector arrays made from low carrier concentration material. In these instances, the diode device structure has an $n$-$p^-$ junction where the *p*-region is of low carrier concentration and tends to invert.

In accordance with the present invention, a method is provided for forming an infrared radiation detector diode of the P-N junction type, wherein unannealed PbSnTe material dominated by *n*-type background impurities is employed as the substrate. In this connection, the present method involves the diffusion of a defect compensating impurity such as cadmium (Cd) or zinc (Zn) into the PbSnTe substrate material to compensate for the *p*-type stoichiometric defects found therein, thereby producing a P-N junction diode detector in which a substantial reduction in the adverse effect of surface inversion layers is effected along with a reduction in surface leakage. The P-N junction diode detector of Cd- or Zn-diffused unannealed PbSnTe substrate material has an improved operating performance, wherein signal radiation is absorbed in the low carrier concentration *n*-layer such that a Burstein shift is not exhibited, while the bulk of the P-N junction is *p*-type material of high carrier concentration to prevent surface inversion.

Other features and advantages of the invention will be more fully understood from the following more detailed description as set forth in the specification, when taken together with the accompanying drawings in which.

Figure 1:
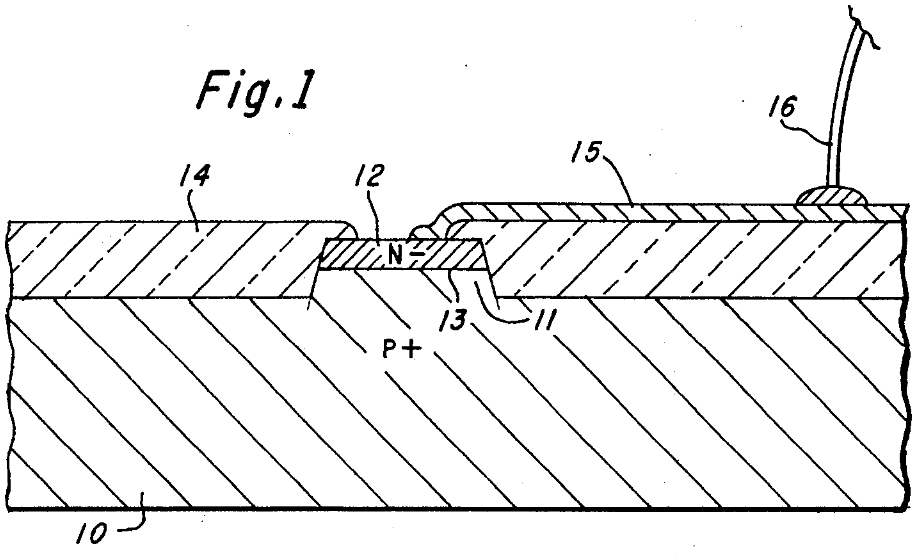
FIG. 1 is a cross-sectional view of a mesa-type diode construction comprising an infrared radiation detector and having a P-N junction formed in accordance with the present invention.

Referring more specifically to the drawings, FIG. 1 illustrates a mesa diode detector made in accordance with the present invention. The mesa diode detector is formed on a substrate 10 of $p^+$-type conductivity PbSnTe material. In the latter connection, it will be understood that mesa diodes are formed by etching procedures after impurity diffusion into the upper surface region of the substrate 10 in providing the P-N junctions of the respective diodes. It will be further understood that the present invention has application to planar diode construction as well in which impurity diffusion would occur through holes etched in a mask evaporated onto the PbSnTe substrate 10. Thus, the following description directed to a mesa diode is by way of an example only. The mesa diode of FIG. 1 includes a region 11 of $p^+$-type PbSnTe material integral with the body of the substrate 10 and forming the lower portion of the mesa diode. The upper portion of the mesa diode is an *n*-region 12 defining a P-N junction 13 at its interface with the lower region 11 of the mesa diode. The manner in which the *n*-region 12 of the P-N junction 13 is formed is critical to the present invention as will be explained hereinafter. The substrate 10 further includes an insulating layer 14 disposed in covering relationship over the top surface thereof, but having respective openings extending therethrough to receive the individual mesa diodes with the upper surface of the *n*-region 12 being exposed.

A thick metal expanded contact 15 is employed as an electrical conductor interconnecting the P-N junction diode to a signal receiver through the use of external jumper wires 16 bonded to the expanded contact 15 by suitable means, such as ball-bonding.

Figure 2:
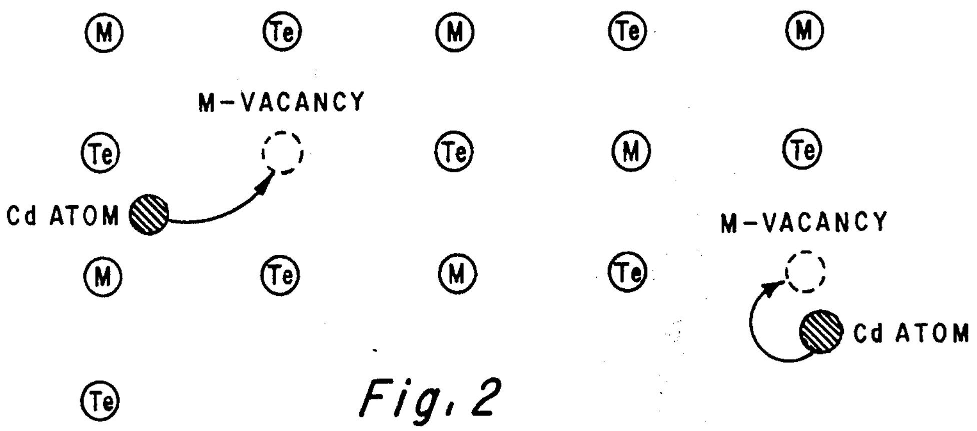
FIG. 2 is a diagrammatic illustration of PbSnTe crystalline material showing the lattice arrangement of metal atoms, including Pb and Sn, and tellurium (Te) atoms in which the material is being subjected to the diffusion of Cd atoms.
Figure 3:
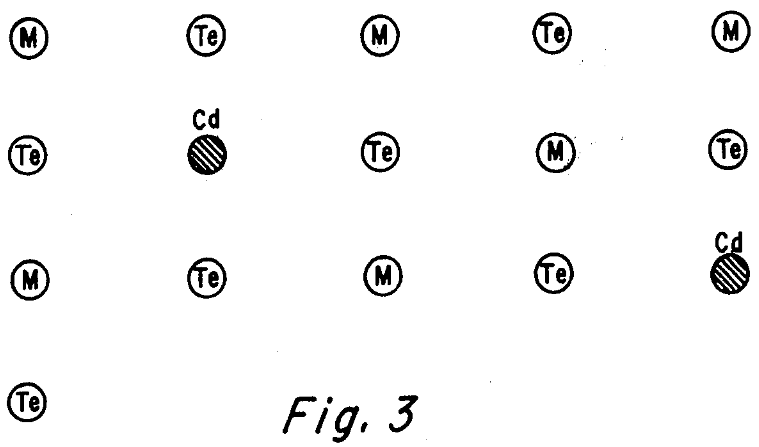
FIG. 3 is a diagrammatic view similar to FIG. 2 of the structure of PbSnTe crystalline material after the diffused Cd atoms have been accepted into the crystalline lattice.

In accordance with the present invention, it has been determined that a P-N junction diode detector of improved performance is produced by subjecting unannealed PbSnTe substrate material having dominating n-type background impurities to an impurity diffusion technique incorporating a defect compensating impurity, Cd or Zn being found effective. In as-grown PbSnTe material, metal atom vacancies occur comprising *p*-type stoichiometric defects. Such vacancies are diagrammatically illustrated in FIG. 2 by the dashed line circles and consist of missing lead (Pb) and tin (Sn) atoms, with Pb vacancies predominating and being of the order of $3 \times 10^{19}/cm^3$. Typically, the *n*-type background impurities in the unannealed PbSnTe material exist in a carrier concentration of the order of $10^{17}/cm^3$. Cd has the same valence as Pb, and the diffusion of Cd into an unannealed as-grown PbSnTe crystalline structure, as depicted in FIG. 2, having *n*-type background impurities results in the Cd atoms assuming the positions of the Pb and Sn vacancies, with the Cd atoms neutralizing the region of the PbSnTe crystal previously dominated by Pb vacancies giving the region a $p^+$-type conductivity. This neutralizing effect of the Cd atoms allows the dominating carrier concentration of the region of the PbSnTe substrate in which the Cd atoms are diffused to be determined by the *n*-type background impurities which will be in a range of the order of $10^{17} - 10^{18}/cm^3$. Thus, the *n*-type background impurities now predominate in the upper region 12 of the mesa diode to form a P-N junction 13 where the diffusion depth ends, with the lower *p*-type region 11 continuing to be dominated by the *p*-type bulk substrate 10 caused by Pb vacancies in the crystalline PbSnTe material. The final arrangement of the crystalline PbSnTe material after subjection to Cd diffusion is illustrated in FIG. 3, wherein the Cd atoms have assumed the positions of the metal vacancies in which Pb vacancies dominate when the PbSnTe crystalline material is of a type with *n*-type background impurities.

The diffusion of Cd into the as-grown PbSnTe crystalline substrate 10 avoids the necessity for an annealing treatment of the substrate to change carrier concentration, thereby shortening the processing time for making a P-N junction diode detector. Additionally, the Cd-diffused P-N junction exhibits a $N^- P^+$ structure which enables signal radiation to be absorbed in the low carrier concentration n-type region 12, thereby being unaffected by a Burstein Shift, while the lower region 11 is of *p*-type of high carrier concentration, thereby preventing surface inversion.

The background carrier concentration of the as-grown PbSnTe crystalline substrate 10 can be controlled to be *n*-type of any carrier concentration desired by employing purification procedures with respect to the PbSnTe starting material to reduce the *n*-type background to less than $10^{16}$ carriers/cm$^3$, and thereafter intentionally doping the PbSnTe crystal during growth with a low level *n*-type impurity, such as aluminum, antimony, and bismuth, for example, to provide a pre-doped *n*-type background carrier concentration of the order of $10^{17}$ carriers/cm$^3$ in the PbSnTe crystal. This pre-doping of the PbSnTe crystal with n-type dopant material sets the background for subsequent Cd diffusion in accordance with the present invention.

A multi-detector array of cadmium-diffused P-N junction diode detectors as constructed in accordance with the present invention exhibited D* detectivities in the $2 \times 10^{10}$ cm-Hz$^{1/2}$/watt range with responsivities in excess of $10^4$ volts/watts. Impedances ranged from several thousand ohms to 27 kilohms, corresponding to an R.A. (bias resistance X area) product of 2.6 ohm-cm$^2$ for the best diode of the array. The relative spectral responses of the best diode element and a relatively poor diode element in the array illustrated quantum behavior with no apparent Burstein Shift. Capacitance-voltage measurements indicated $1/C^2$ variation with a resultant background carrier concentration of $1.8 \times 10^{17}/cm^3$ on the basis of a dielectric constant of 2,000. The capacitance variation was well behaved and no change of slope was observed indicative of no significant contribution from an inversion layer.

Figures 4, 6:
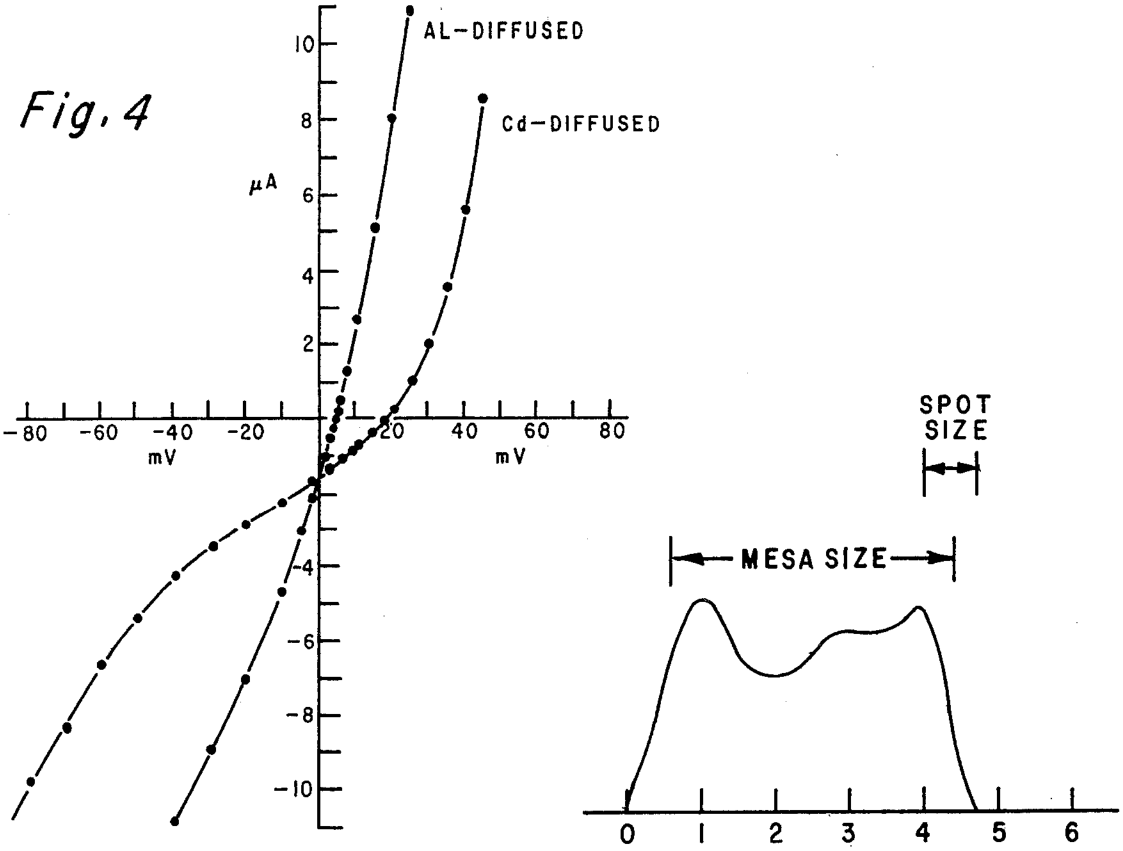
FIG. 4 is a graph of current-voltage characteristics of an aluminum-diffused diode detector as compared to a cadmium-diffused diode detector made in accordance with the present invention.
FIG. 6 is a graph illustrating spectral response data of a Cd-diffused mesa diode detector made in accordance with the method of the present invention as subjected to spot scanning.

FIG. 4 graphically illustrates the current/voltage characteristics of an aluminum-diffused mesa diode detector as contrasted to a cadmium-diffused mesa diode detector constructed in accordance with the present invention. As compared to the cadmium-diffused diode, the aluminum-diffused diode shows low impedance at zero bias resistance, while the cadmium-diffused diode offers a large impedance greater than 20 kilohms at zero bias resistance. Thus, the performance of the aluminum-diffused diode detector was adversely affected by signal leakage at zero bias caused by the presence of an inversion region extending beyong the mesa. The presence of this region is characteristic of the low carrier concentration material used in aluminum diffusion which is subject to inversion. Conversely, the cadmium-diffused diode detector produced in accordance with the present invention by virtue of the high carrier concentration of the *p*-type PbSnTe substrate substantially eliminated surface inversion and leakage at zero bias to provide an improved operating performance.

Figure 5:
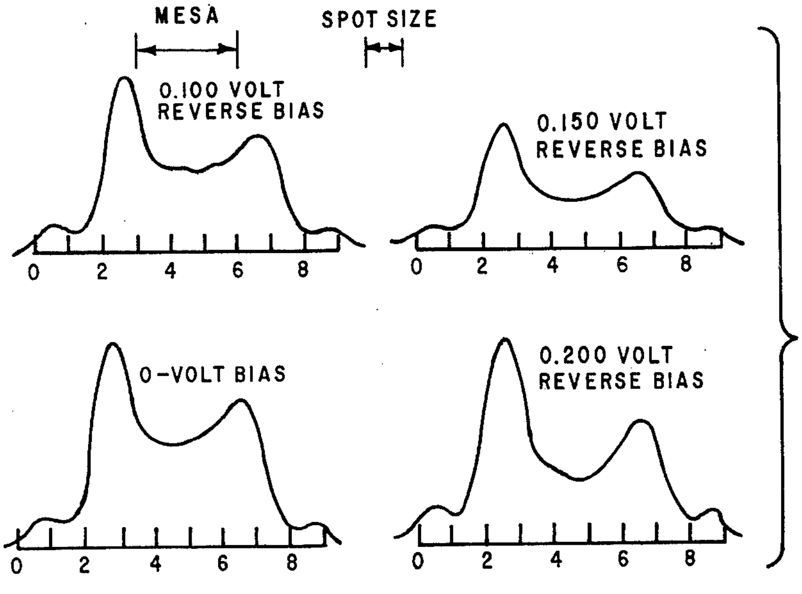
FIG. 5 is a graph illustrating the spectral response from an aluminum-diffused mesa diode detector at differing zero bias resistances when subjected to spot scans of infrared radiation.

The graphs of FIGS. 5 and 6 respectively show performance profiles for an aluminum-diffused mesa diode detector (FIG. 5) and for a cadmium-diffused mesa diode detector as produced in accordance with the present invention (FIG. 6). These performance profiles clearly indicate the existence of an inversion layer in the aluminum-diffused diode, since the spot scans of infrared radiation taken across the mesa of the aluminum-diffused diode show an area of detection larger than the mesa area of the aluminum-diffused diode. It is evident from FIG. 5 that a considerable contribution to the signal produced from the aluminum-diffused diode exists beyond the mesa. Contrasted to this performance, the graph illustrated in FIG. 6 shows a close correlation between the received signal and the size of the mesa in a cadmium-diffused mesa diode detector constructed in accordance with the present invention indicating the absence of an inversion layer extending beyond the mesa.

For purposes of a specific example, cadmium diffusion in the as-grown PbSnTe crystalline material was carried out at a temperature of 400°C, wherein the PbSnTe crystal was placed in a quartz ampoule with a charge of Cd, the ampoule being first evacuated and then back-filled with hydrogen. The Cd charge may consist of a 4–10 milligram piece of cadmium. The vapor pressure of cadmium is sufficient at 400°C to provide uniform surface concentration. After diffusion of the cadmium for 1.5 hours, the surface of the PbSnTe material exposed thereto was uniformly gray due to the formation of a (CdTe) $Pb_1Sn_1$ alloy which acted as an infinite diffusion source. The depth of the resulting P-N junction was 10 microns at room temperature.

While this invention has been particularly described in relation to the diffusion of Cd into crystalline PbSnTe material having *n*-type background impurities, it will be understood that Zn diffusion may be alternatively employed in place of the Cd.

It will be seen that a method has been provided for producing a PbSnTe photovoltaic infrared radiation detector of the P-N junction type offering improved operating performance through the avoidance of a Burstein shift and the substantial absence of any inversion effect associated with diode detectors of this character heretofore. Although preferred embodiments of the invention have been specifically described, it will be understood that the invention is to be limited only by the appended claims, since variations and modifications of the preferred embodiments will be apparent to those skilled in the art.

What is claimed is:

1. In a method of making a photovoltaic infrared radiation diode detector, the steps comprising:

providing a substrate material of unannealed PbSnTe crystal having *n*-type background impurities and with a crystalline lattice having metal vacancies therein of predominately Pb so as to be *p*-type conductivity material of high carrier concentration; and diffusing a defect compensating impurity taken from the class consisting of Cd and Zn into a surface of said PbSnTe material to compensate for the *p*-type stoichiometric defects resulting from the Pb vacancies found therein so that a P-N junction of $N^- - P^+$ structure is formed by virtue of the *n*-type background impurities becoming dominant in the region of the PbSnTe substrate into which the defect compensating impurity is diffused.

2. A method as set forth in claim 1, wherein Cd atoms are diffused into the unannealed PbSnTe substrate in forming the P-N junction.

3. A method as set forth in claim 1, wherein Zn atoms are diffused into the unannealed PbSnTe substrate in forming the P-N junction.

4. A method as set forth in claim 1, further including initially doping the PbSnTe crystal during growth with a low level *n*-type impurity taken from the class consisting of aluminum, antimony, and bismuth to provide a PbSnTe crystal having an *n*-type carrier concentration in the range of $10^{17}$ carriers/$cm^3$ to serve as the *n*-type background impurities in said PbSnTe crystal material.

5. A photovoltaic infrared radiation diode detector comprising:

a substrate of unannealed PbSnTe crystal material having *n*-type background impurities, said PbSnTe material having stoichiometric defects in the crystalline lattice thereof in the form of metal vacancies in which Pb vacancies dominate causing the PbSnTe material to exhibit $p^+$-type conductivity;

said substrate having a P-N junction formed therein including a first lower region of $p^+$-type conductivity adjacent the bulk of the substrate and a second upper region of $n^-$-type conductivity overlying said first region with the interface therebetween defining said P-N junction; and said second region being characterized by the presence of defect compensating impurities taken from the class of Cd and Zn, said defect compensating impurities being disposed respectively in the metal vacancies of the crystalline lattice of the PbSnTe material and neutralizing the $p^+$-type conductivity associated therewith such that the *n*-type background impurities of the PbSnTe material are determinative of the conductivity type of said second upper region.

6. A detector as set forth in claim 5, further including an insulation layer overlying said substrate and having an opening extending therethrough, said P-N junction being in registration with the opening through said insulating layer with said second upper $n^-$-type region thereof being exposed, and electrical conductor means connected to said second upper $n^-$-type region of said P-N junction.

7. A detector as set forth in claim 5, wherein the defect compensating impurity present in said second upper region of said P-N junction is Cd.

8. A detector as set forth in claim 5, wherein said defect compensating impurity present in said second upper region of said P-N junction is Zn.

9. A detector as set forth in claim 5, wherein the PbSnTe material of said substrate and said first lower region of said P-N junction exhibit stoichiometric defects in the crystalline lattice thereof in the form of missing Pb and Sn atoms, with Pb vacancies predominating and being of the order of $3 \times 10^{19}/cm^3$, and the background carrier concentration of the *n*-type impurities in the PbSnTe material including the second upper region of said P-N junction is of the order of $10^{17}/cm^3$ such that the structure forming said P-N junction consists of a first lower region of $p^+$-type and a second upper region of $n^-$-type conductivity.

* * * * *